United States Patent [19]

Omoda et al.

[11] Patent Number: 4,675,809
[45] Date of Patent: Jun. 23, 1987

[54] DATA PROCESSING SYSTEM FOR FLOATING POINT DATA HAVING A VARIABLE LENGTH EXPONENT PART

[75] Inventors: Koichiro Omoda, Sagamihara; Hozumi Hamada, Chouhu; Sakae Takahashi, Tama, all of Japan

[73] Assignee: Hitachi, Ltd., Tokyo, Japan

[21] Appl. No.: 666,748

[22] Filed: Oct. 31, 1984

[30] Foreign Application Priority Data

Nov. 2, 1983 [JP] Japan .................................. 58-204829

[51] Int. Cl.[4] ............................................. G06F 15/31
[52] U.S. Cl. ..................................... 364/200; 364/748; 340/347 DD; 235/310; 235/311
[58] Field of Search ................ 364/200 MS File, 748, 364/900 MS File; 340/347 DD; 235/311, 310

[56] References Cited

U.S. PATENT DOCUMENTS

| | | | |
|---|---|---|---|
| 4,189,715 | 2/1980 | Duttweiler | 340/347 DD |
| 4,608,554 | 8/1986 | Blair | 235/310 |
| 4,617,641 | 10/1986 | Hamada | 364/748 |
| 4,620,292 | 10/1986 | Hagiwara | 235/310 |

OTHER PUBLICATIONS

IBM Technical Disclosure Bulletin, vol. 23, No. 1, Jun. 1980, "Biased and Non-Biased Binary Conversion and Exponent Under/Over Flow Dectection", J. L. Hale, R. C. Letterey, D. T. Shen and K. G. Tan, pp. 252-254.

Primary Examiner—Archie E. Williams
Assistant Examiner—Emily Yue Chan
Attorney, Agent, or Firm—Antonelli, Terry & Wands

[57] ABSTRACT

An execution processing device for executing variable length floating-point data of exponent part designated by two or more kinds of representation systems and fixed length floating-point data of exponent part designated by two or more kinds of representation systems, includes a converting circuit which converts the data of various representation systems into a common representation system which is capable of expressing the data in a common data form responsive to an operation mode that is provided to discriminate the various representation systems at the time of reading and operating on the data of the various representation systems stored in a storage unit according to the same load instruction. An arithmetic unit introduces the data converted by said converting circuit into the common representation system, which performs the operation designated by the same instruction, and which produces the operation result as the data of the common representation system. A converting circuit converts the data of the common representation system into said various representation systems to store them in the storage unit responsive to the operation mode at the time of storing the data produced from the arithmetic unit in the storage unit according to the same store instruction.

6 Claims, 12 Drawing Figures

DATA PROCESSING SYSTEM FOR FLOATING POINT DATA HAVING A VARIABLE LENGTH EXPONENT PART

CROSS REFERENCE TO RELATED APPLICATION

The Hamada et al U.S. application Ser. No. 543,426 describes floating point data having a variable-length exponent part and may be referred to for a more detailed explanation of this type of data.

BACKGROUND OF THE INVENTION

1. Field of the Invention

The present invention relates to an execution processing device, and particularly to an execution processing device which efficiently performs floating-point operations for both variable length representation of an exponent part and fixed length representation of an exponent part.

2. Description of the Prior Art

The floating-point representation is capable of dealing with large numbers and small numbers while maintaining the same precision and is utilized particularly in scientific and technical calculations.

According to the conventional floating-point representation in which the length of the exponent part is fixed, however, the range of numbers to be expressed is limited. Further, even when the value of the exponent part is small and only a small amount of data is required, it was not possible to utilize the space in order to increase the precision of the mantissa part. In order to improve these defects, therefore, it has been desired to develop a floating-point operation relying upon the variable length representation of an exponent part instead of relying upon the fixed length representation of the exponent part.

The floating-point representation usually assumes the form as shown in FIG. 1, wherein reference numeral 1 denotes a sign part that represents the sign of mantissa part, 2 denotes an exponent part, and 3 denotes a mantissa part.

FIG. 2 illustrates a typical example of the conventional floating-point representation.

In FIG. 2, reference numeral 1 denotes a sign part that represents the sign of a mantissa part and that consists of one bit, 4 denotes an exponent part which consists of 7 bits and in which a value is expressed with complement notations of 2, reference numeral 5 denotes a mantissa part of absolute value notation (here, however, the mantissa part is normalized and 1 at the most significant position is concealed) which consists of 24 bits in the case of single precision data or which consists of 56 bits in the case of double precision data, and 6 denotes a separating point between the exponent part and the mantissa part. According to the conventional floating-point representation, the separating point has been fixed between the exponent part and the mantissa part. In performing the arithmetic operation such as addition, subtraction, multiplication and division relying upon the conventional fixed length floating-point representation of the exponent part, therefore, the exponent part and the mantissa part could be easily separated, and the arithmetic operation could be controlled relatively easily since the bit numbers of the exponent part and the mantissa part were fixed.

FIG. 3 illustrates a variable length representation of the exponent part as employed in the present invention, wherein reference numeral 1 denotes a sign part, 6 denotes a separating point, 7 denotes a first exponent part (often called the front part of the exponent part), 8 denotes an exponent part length dividing part, 9 denotes a second exponent part (often called the back part of the exponent part), and 10 denotes a mantissa part.

According to the variable length representation of the exponent part as shown in FIG. 3, though the total number of bits of the sign part, the exponent part and the mantissa part is fixed, the bit length of the exponent part and the mantissa part varies within the limited range, i.e., the separating point moves between the exponent part and the mantissa part, as will be mentioned later in detail.

Therefore, although the above-mentioned advantage is obtained, the arithmetic operation is controlled in a more complex manner than in the case of the fixed length representation of the exponent part.

Further, almost all of the scientific and technical programs developed thus far are based upon the fixed length data of the exponent part. Accordingly, the execution processing device must be constructed so as to be capable of executing the operations of fixed length data of the exponent part in addition to the operations of variable length data of the exponent part. In this case, however, it becomes more complex to control the arithmetic operation. Moreover, operations of the two data must be executed, and instructions are required in two sets to distinguish the instruction which designates loading of the two data from the memory and the instruction which designates storing the results of two arithmetic operations.

Hereinafter, the fixed length representation of the exponent part and the fixed length data of the exponent part are simply referred to as fixed length representation and fixed length data, and variable length representation of the exponent part and variable length data of the exponent part are simply referred to as variable length representation and variable length data.

SUMMARY OF THE INVENTION

The present invention serves to solve the above-mentioned problems inherent in the conventional art, and its object is to provide an efficient and simplified execution processing device which is capable of executing floating-point operations of both the variable length representation of the exponent part and the fixed length representation of the exponent part, wherein the data in the floating-point register used in the floating-point operation and in the arithmetic unit which performs the addition, subtraction, multiplication and division operations, are commonly represented and are commonly utilized for the two operations.

Another object of the present invention is to provide an execution processing device wherein an operation mode is introduced to distinguish the two floating-point operations, whereby two sets of instructions are not required but only one set of instructions is used, thereby enhancing the efficiency. In practice, from the standpoint of the processing content of the program, the operation mode is not switched so frequently, and the overhead for switching can be neglected.

In order to accomplish the above-mentioned objects, the present invention provides an execution processing device for executing variable length floating-point data of the exponent part designated by two or more kinds of representation systems and fixed length floating-point data of the exponent part designated by two or more kinds of representation systems, wherein the improvement comprises:

first conversion means which converts the data of said various representation systems into a common representation system which is capable of expressing the data in a common data form responsive to an operation mode that is provided to discriminate said various representation systems at the time of reading and operating the data of said various representation systems stored in a storage unit according to the same load instruction;

operation means which introduces the data converted by said first conversion means into said common representation system, which performs the operation designated by the same instruction, and which produces the operated result as the data of said common representation system; and second conversion means which converts the data of said common representation system into said various representation systems to store them in said storage unit responsive to said operation mode at the time of storing said data produced from said operation means in said storage unit according to the same store instruction.

BRIEF DESCRIPTION OF THE DRAWINGS

FIGS. 7 to 10 are diagrams to explain the embodiment of the present invention, wherein:

FIG. 7 is a diagram showing a common representation data form used in the present invention;

FIGS. 8(a) and 8(b) are a diagram showing the data conversion from the fixed length representation into the common representation;

FIG. 9 is a diagram showing the data conversion from the variable length representation into the common representation; and FIG. 10 is a diagram showing the data conversion from the common representation into the variable length representation.

DETAILED DESCRIPTION OF THE PREFERRED EMBODIMENT

Figure 4:
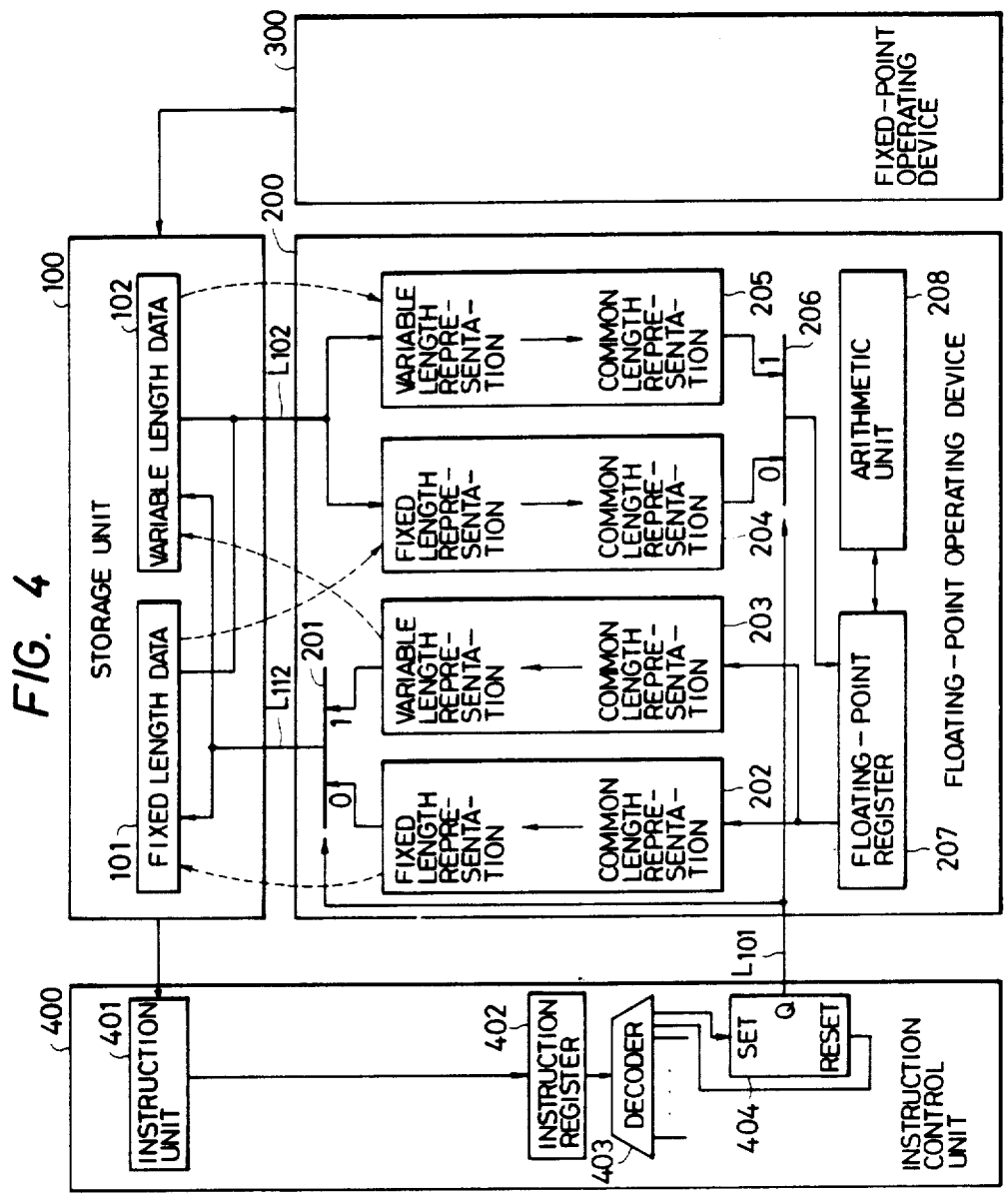
FIG. 4 is a diagram which schematically illustrates the present invention.

The invention will be schematically described below with reference to FIG. 4, in which reference numeral 100 denotes a storage unit, 101 and 102 denote, respectively, fixed length data and variable length data stored in the storage unit 100, reference numeral 200 denotes a floating-point operating device, 201 denotes a selector, 202 denotes a converting circuit for converting a common length representation into a fixed length representation, 203 denotes a converting circuit for converting a common length representation into a variable length representation, 204 denotes a converting circuit for converting a fixed length representation into a common length representation, 205 denotes a converting circuit for converting a variable length representation into a common length representation, 206 denotes a selector, 207 denotes a floating-point register FR, 208 denotes an arithmetic unit, 300 denotes a fixedpoint operating device, 400 denotes an instruction control unit, 401 denotes an instruction unit, 402 denotes an instruction register, 403 denotes a decoder, and 404 denotes an operation mode latch.

The fixed length data and variable length data stored in the storage unit 100 are read out by the same load instruction and are stored in the floating-point register FR 207. In this case, the fixed length data is converted into a common length representation by the converting circuit 204 and is transferred to the floating-point register FR 207 via the selector 206, while the variable length data is converted into a common length representation by the converting circuit 205 and is transferred to the floating-point register 207 via the selector 206. Here, prior to executing the instruction, the operation mode latch 404 is reset to 0 in the former case, and is reset to 1 in the latter case.

The common length representation will be described below. In the common length representation, the separating point is variable between the exponent part and the mantissa part, but the total number of bits is constant. Therefore, the data of variable length representation can be expressed by using an expanded fixed length representation consisting of bits of maximum possible numbers of the exponent part and the mantissa part. Here, the expanded fixed length representation is called common length representation. The data of fixed length representation can also be expressed by the common length representation, as a matter of course.

The bit number of the exponent part by the common length representation need not necessarily be selected to be a maximum possible bit number of the variable length representation but may be smaller than the maximum bit number by taking into consideration the limitation imposed on the implementation or suitable range of numerical representation.

Then, the data of common length representation stored in the register 207 is read out, operated on by the arithmetic unit 208, and the operated result of common length representation is returned to the register 207.

Finally, the operated result of common length representation is written from the register 207 onto the storage unit 100 as described below.

When the operated result is to be written as the fixed length data, the operated result from the register 207 is converted into a fixed length representation by the converting circuit 202 and is transferred to the storage unit 100 via the selector 201. When the operated result is to be written as variable length data, the operated result from the register 207 is converted into a variable length representation by the converting circuit 203, and is transferred to the storage unit 100 via the selector 201.

In executing the processing using modern computers, furthermore, multiprogramming is performed. Therefore, it often happens that the program being executed is interrupted, and executed is then received. In this case, the register 207 must perform the refuge/restore operation. There will be no problem if the register 207 is restored with the same operation mode as the operation mode of taking refuge. The problem, however, arises in regard to the refuge/restore operation when the operation mode is frequently switched and data of a different operation mode is provided in the register 207 at the time of taking refuge. To cope with this problem, a limitation should be provided such that when the operation mode is switched, the register 207 contains no effective data of the previous mode (i.e., contains no data that will be used again later).

In practice, however, such a problem seldom develops, and the operation mode which is usually used is fixed by the program.

Prior to explaining the execution processing device of the present invention in detail, the variable length representation used in the present invention will first be described below in detail.

Figure 3:
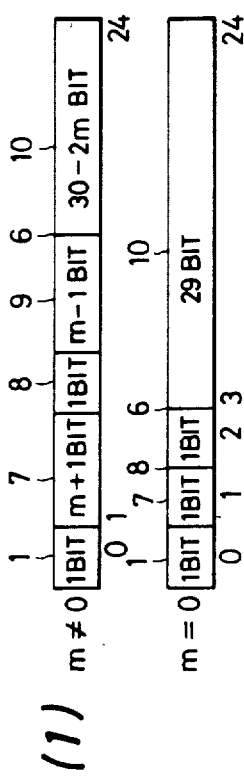
FIGS. 3(1) and 3(2) are a diagram showing forms of variable length floating-point data of exponent part employed in the present invention.
Figure 3:
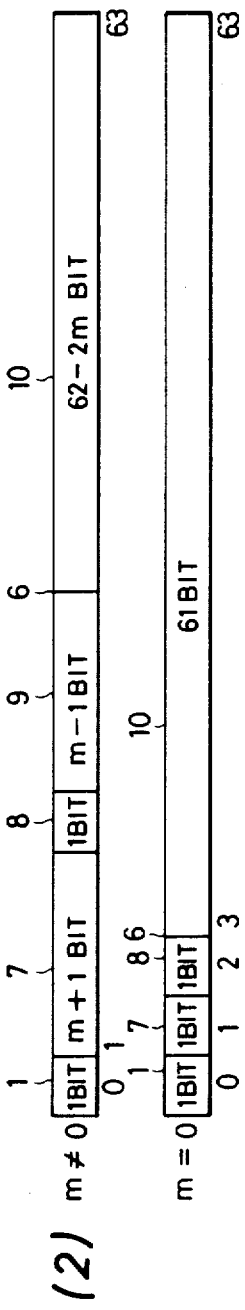

The important point of the variable length representation is that the length of the exponent part is determined by a preceding column of 0 in the exponent part or by the column of 1 (which corresponds to the first exponent part 7 in FIG. 3). Therefore, numerals close to 1, that appear frequently everyday can be expressed more precisely than with the conventional fixed length representation, since it is allowed to shorten the exponent part and to lengthen the mantissa part. Further, since the exponent part can be lengthened, it is also possible to express extremely large numbers or extremely small numbers that could not be expressed thus far.

A numeral to be expressed is denoted by x. This is expressed by two numerals, i.e., e and f, $$x = 2^e \times f \tag{1}$$

Here, in order to uniformalize the value, the following conditions are provided for e and f.

First, when $x > 0$.

$$e: \text{integer} \tag{2}$$

$$1 \leq f < 2 \tag{3}$$

$$f = 1 \cdot f_1 f_2 \cdots f_j \cdots \tag{4}$$

In the equation (4), $f_1 f_2 \cdots f_j \cdots$ is referred to as a bit pattern of the mantissa part. The same pattern is also employed for the mantissa part in the fixed length representation and the common length representation employed in the embodiment of the present invention.

When $e > 0$, the range in which e can just be expressed by binary $m(>0)$ digit is given by, $$2^{m-1} \leq e \leq 2^m - 1 \tag{5}$$

If the range of f of the equation (3) is included therein, so as to express in terms of the range of x, we obtain, $$2^{2m-1} \leq x < 2^{2m} \tag{6}$$

When $e < 0$, if, $$2^{-2m} \leq x < 2^{-2m-1} \tag{7}$$

to express in terms of the range of e, we obtain, $$-2^m \leq e < -2^{m-1} \tag{8}$$

From the equation (8), the expression of e is considered to be an expression of the complement of 2. Further, the mantissa f is given by, $$-2 \leq f < 1 \tag{3}'$$

when $x < 0$. The equations (5) and (8) do not include the cases where $e = 0, -1$, but are considered to include the case where $m = 0$. Including these cases, the internal expressions of the integer e of the case where e is just expressed by a binary m digit, are given as follows:

$$\begin{array}{ll} \text{When } e \geq 0 & 0 \cdots 0 \; 1 \; e_{m-1} \cdots e_2 e_1 \\ \text{When } e < 0 & 1 \cdots 1 \; 0 \; e_{m-1} \cdots e_2 e_1 \end{array} \tag{9}$$

From the above m and $e_{m-1} \cdots e_2 e_1$, a discrimination bit column of m is added to the left, and the exponent part is constituted as follows:

When $e \geq 0$    In a number of $m + 1$ $$\underbrace{1 \cdots 1}_{(a)} \underbrace{0}_{(b)} \underbrace{e_{m-1} \cdots e_2 e_1}_{(c)}$$

When $e < 0$    In a number of $m + 1$ $$\underbrace{0 \cdots 0}_{(a)} \underbrace{1}_{(b)} \underbrace{e_{m-1} \cdots e_2 e_1}_{(c)} \tag{10}$$

The order of magnitude of the bit column of the equation (10), as a fixed point binary number without a sign, is in agreement with the order of magnitude of e. The order of x is in agreement with the order of magnitude of e, even if the mantissa part is taken into consideration.

Nearly the same as above also holds true even when $x < 0$. Namely, $$-2^{2m} \leq x < -2^{2m-1} \tag{6}'$$

holds instead of the equation (6). Further, $$-2^{-2m-1} \leq x < -2^{-2m} \tag{7}'$$

holds instead of the equation (7).

When $x < 0$, the order of the equation (10) should be reversed by taking into consideration the fact that the order of x is opposite to the order of e. This can be obtained by the complement of 1. Instead of the equation (10), therefore, there holds:

When $e \geq 0$    In a number of $m + 1$ $$\underbrace{0 \cdots 0}_{(a)} \underbrace{1}_{(b)} \underbrace{\overline{e_{m-1}} \cdots \overline{e_2} \; \overline{e_1}}_{(c)}$$

When $e < 0$    In a number of $m + 1$ $$\underbrace{1 \cdots 1}_{(a)} \underbrace{0}_{(b)} \underbrace{\overline{e_{m-1}} \cdots \overline{e_2} \; \overline{e_1}}_{(c)} \tag{10}'$$

Here, the upper lines represent an inversion operation of 0 and 1 for each bit.

The parts a, b, and c in the above equations (10), (10)' correspond to the first exponent part 7, exponent part length dividing part 8, and second exponent part 9 illustrated with reference to FIG. 3.

Figure 5:
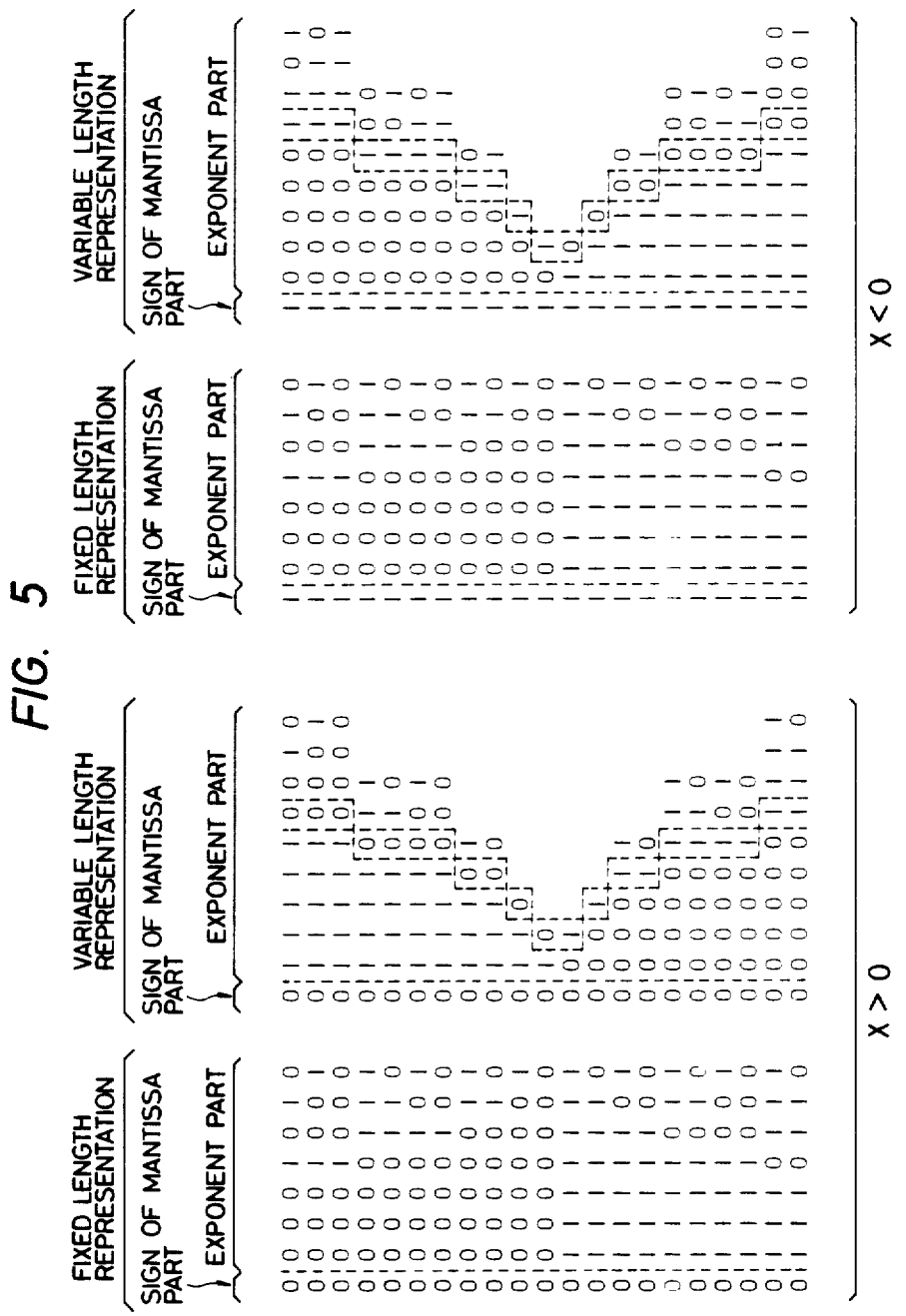
FIG. 5 is a diagram illustrating the variable length representation employed in the present invention in comparison with the conventional fixed length representation.

FIG. 5 illustrates numerals of the above-mentioned variable length representation in comparison with numerals of the conventional fixed length representation.

Figure 6:
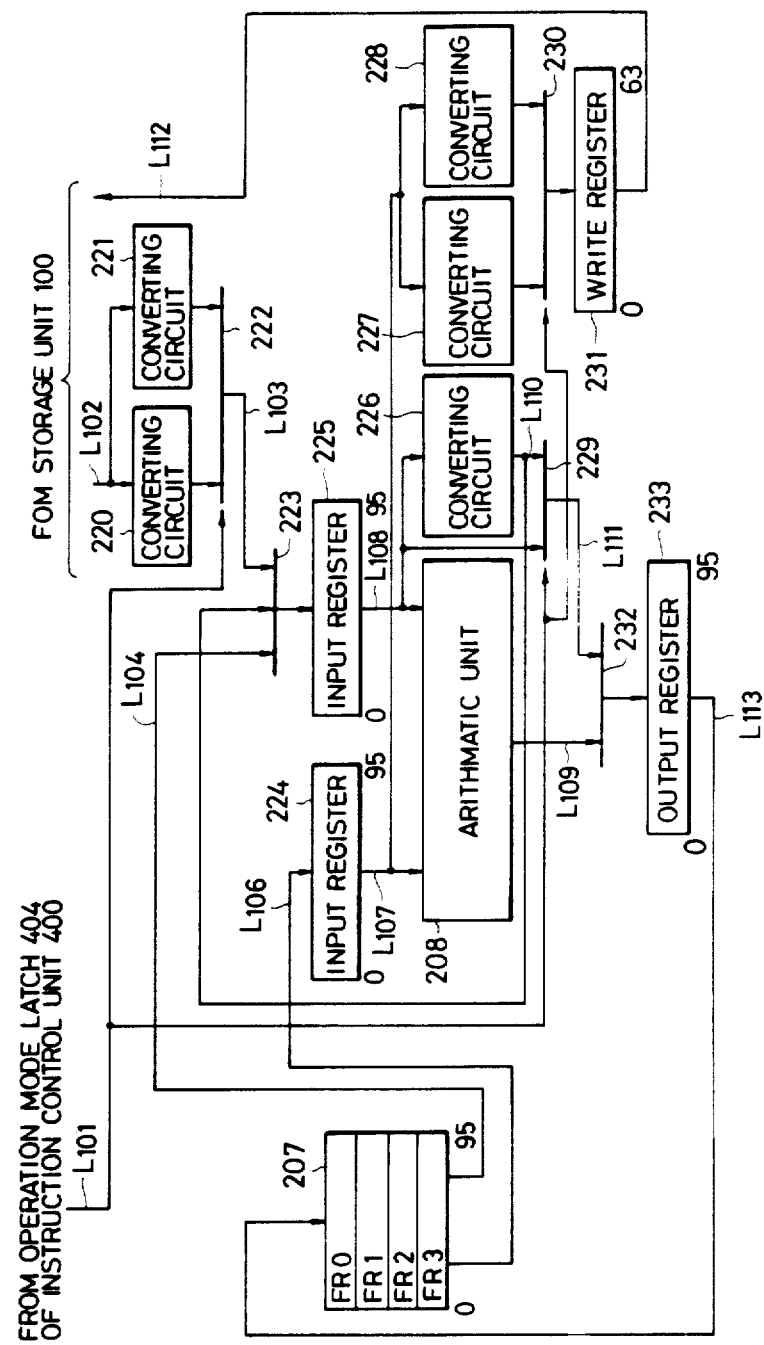
FIG. 6 is a block diagram illustrating an embodiment of the present invention.

FIG. 6 is a diagram illustrating the structure according to an embodiment of the present invention, wherein reference numeral 207 denotes a floating-point register consisting of four registers FR0 to FR3, 208 denotes an arithmetic unit, reference numerals 220, 221, 226, 227 and 228 denote converting circuits, reference numerals 222, 223, 229, 230 and 232 denote selectors, 224 and 225 denote input registers, 231 denotes a write register, 233 denotes an output register, and L101 to L113 denote signal lines. For the purpose of explanation, the data used in this embodiment is expressed in the following forms:

Data of fixed length representation: Double precision shown in FIG. 2 (the data length consists of 64 bits).

Data of variable length representation: Double precision shown in FIG. 3 (the data length consists of 64 bits).

Figures 7, 8A, 8B:
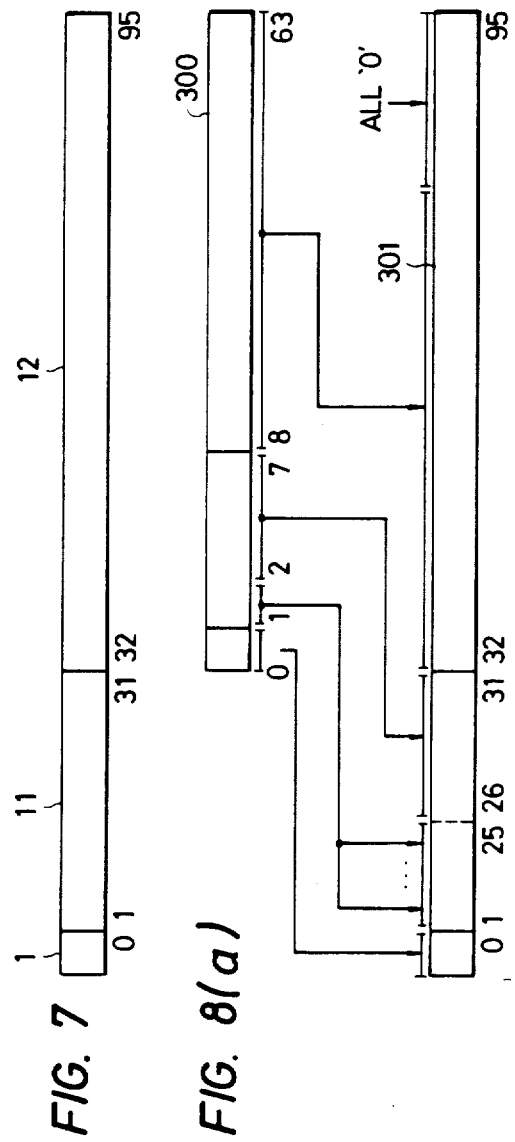

Data of common length representation: If double precision of FIG. 3 is used as mentioned above as the data of variable length representation, a maximum bit length in the mantissa part consists of 61 bits. A minimum length consists of 0 bit (f is regarded to be from 1.0 to 0). Further, a maximum bit number of the exponent part is assumed to be 31 bits when the data of variable length representation is expressed by an expanded fixed length representation. This is the value at the time when the bit number in the exponent part increases, and the bit number in the mantissa part decreases correspondingly and reaches 0. Namely, the data of a sufficiently wide range can be expressed. In practice, the data of a wider range can be expressed. That is, the bit number of the mantissa part becomes zero, and the first exponent part shown in FIG. 3 can be increased (the second exponent part decreases correspondingly). Therefore, the data of common length representation is as shown in FIG. 7, wherein reference numeral 1 denotes a sign part consisting of one bit, 11 denotes an exponent part consisting of 31 bits, and 12 denotes a mantissa part consisting of 64 bits (a maximum of 61 bits will be sufficient, but it is normalized to byte units each consisting of 8 bits, i.e., 64 bits).

The floating-point execution processing will be described below in conjunction with FIG. 6. The following three fundamental instructions will first be explained.

Load instruction: Data stored in the storage unit 100 is read out and is stored in the floating-point registers (FR0 to FR3) 207.

Operation instruction: Arithmetic operation is performed such as addition, subtraction, multiplication and division between the two data, and the operated result is stored in the floating-point registers (FR0 to FR3) 207. In this case, the two data that are input may be read out from the floating-point register 207, or one of them may be read out from the storage unit 100. The former is referred to as a FR-FR operation instruction, and the latter is referred to as a FR-memory operation instruction.

Store instruction: The operated result stored in the floating-point register 207, is written onto the storage unit 100.

Operations of the above-mentioned three instructions will be described below.

(1) Load instruction (FRi←memory data)

Fixed length data and variable length data stored in the storage unit 100 are read out according to the same load instruction and are stored in a floating-point register FRi (i=0, 1, 2, 3) of a number designated by the instruction. In the case of the fixed length data, i.e., when the operation mode is a 0 that is transferred from the instruction control unit 400 via the signal line L101, the read data transferred from the storage unit 100 via the signal line L102 is set into the iinput register 225 via converting circuit 220, selector 222, signal line L103 and selector 223. In the case of the variable length data, i.e., when the operation mode is 1, on the other hand, the read data is set into the input register 225 via converting circuit 221, selector 222, signal line L103, and selector 223.

Figure 9:
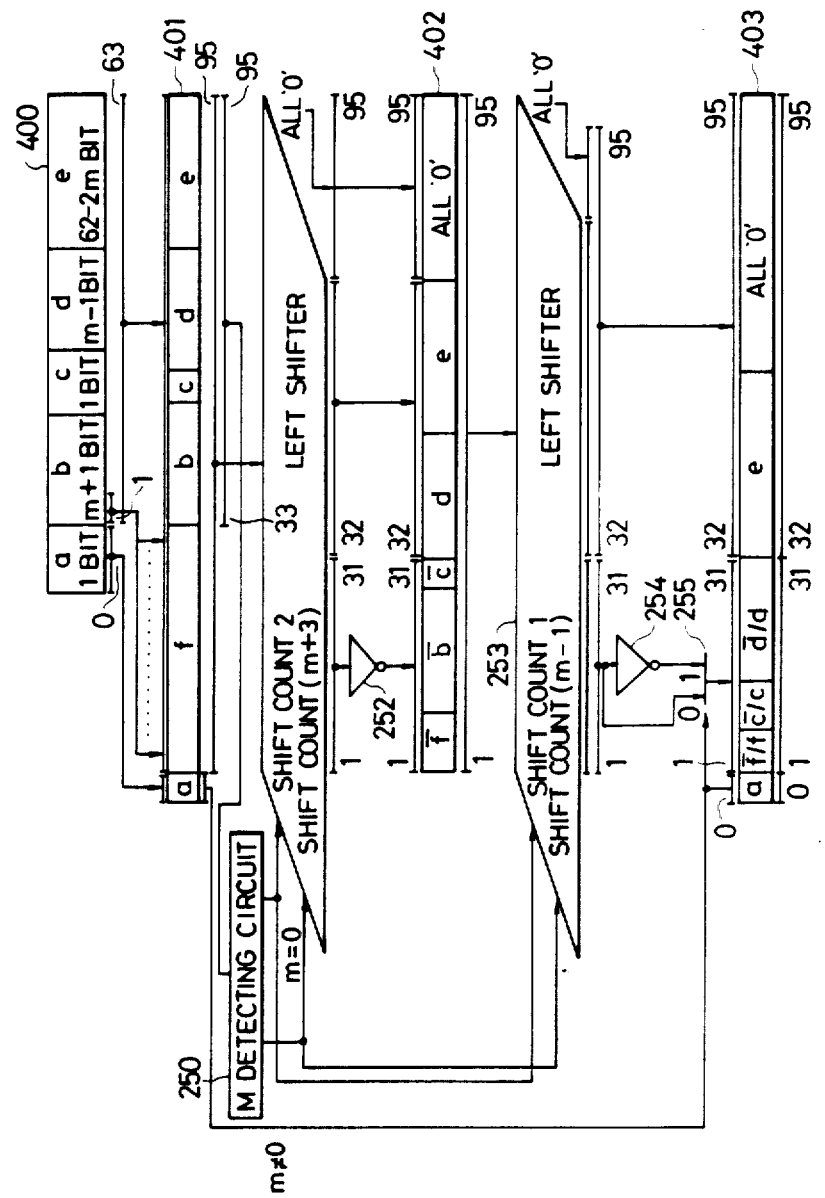

Here, the converting circuit 220 converts the fixed length data of register 300 into a common data of register 301 as shown in FIG. 8(a). The converting circuit 221 converts the variable length data of register 400 into an intermediate data of register 401 as shown in FIG. 9. That is, the fixed length data has already been converted into the data of common length representation at the moment when it is set into the input register 225. However, the variable length data has not yet been converted into the common data.

In the case of the fixed length data, therefore, the common data set into the input register 225 is transferred to the floating-point register FRi via signal line L108, selector 229, signal L111, selector 232, output register 233 and signal line L113, to complete the processing of load instruction. In the case of the variable length data, on the other hand, the intermediate data set into the input register 225 is input to the converting circuit 226 via signal line L108. The intermediate data is then converted into common length data, and is transferred to the floating-point register FRi via signal line L110, selector 229, signal line L111, selector 232, output register 233 and signal line L113, to complete the processing.

The converting circuit 226 converts the data into common length data of register 403 via intermediate data from the register 402 as shown in FIG. 9. Reference numeral 250 denotes an m detecting circuit (m corresponds to m of FIG. 3), 251 and 253 denote left shifters, 252 and 254 denote inverter circuits, and 255 denotes a selector.

FIG. 9 illustrates the operation for converting fixed length data into a common length data, which, however, may be replaced by any other concrete means having an equal function, as a matter of course.

The m detecting circuit 250 counts the number of continuous all 1 or all 0. This, however, can be easily realized by utilizing the logic construction for counting the number of continuous all "0" from the most significant bit of the mantissa part in the normalization processing employed in the existing floating-point arithmetic unit.

In effect, FIG. 9 shows the circuit setup which consists of a combination of converting circuits 221 and 226 of FIG. 6. In the circuit of FIG. 9, in practice, though not illustrated, the selectors 222, 223, and input register 225 of FIG. 6 are inserted between the register 401 and the left shifter 251.

(2) Operation Instruction (a) FR-FR operation instruction (FRi←FRi(op)FRj)

Read data from the floating-point register FRi is set into the input register 224 via signal line L106, and other read data from the floating-point register FRj is set into the input register 225 via signal line L104 and selector 223. Values set into the input registers 224, 225 are directly input to the arithmetic unit 208 via signal lines L107, L108, and they are subjected to a designated arithmetic operation to obtain data of common representation. The operated result expressed by the common representation is transferred to the floating-point register FRi via signal line L109, selector 232, output register 233 and signal line L113, to complete the processing irrespective of the operation mode.

Figure 1:
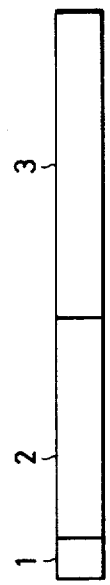
FIGS. 1 and 2 are diagrams showing conventional forms of fixed length floating-point data of exponent part.
Figure 2:
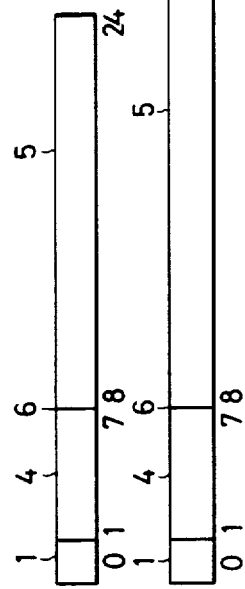

The arithmetic unit 208 introduces the data of common representation, performs a floating-point operation, such as one of the four common types of arithmetic operation, and produces the operated result as a common representation which, fundamentally, is the same as the conventional fixed length representation shown in FIG. 2. Namely, the common representation if obtained by simply expanding the bit number of the exponent part and the mantissa part as shown in FIG. 3. Therefore, the arithmetic unit 208 can be easily realized by expanding the width of the operation data in the exponent part and in the mantissa part by an amount as required, using the existing arithmetic unit that operates on the data of fixed length representation.

(b) FR—memory operation instruction (FRi←FRi(op) memory data)

The read data from the floating-point register FRi is set into the input register 224 via signal line L106. Other data is read out from the storage unit 100 and is set into the input register 225. In this case, the fixed length data and the variable length data are distinguished depending upon the operation mode, and are set into the input register 225 via the same paths as those of the load instruction.

In the operation mode of fixed length, values set into the input registers 224, 225 are directly input to the arithmetic unit 208 where they are subjected to an operation to obtain data of common representation.

In the operation mode of variable length, on the other hand, the value set into the input register 225 has not yet been converted into the data of common representation and is, hence, input to the converting circuit 226 via signal line L108 and is converted into the data of common representation which is then set again into the input register 225 via signal line L110 and selector 223. Thereafter, the values of input registers 224, 225 are input to the arithmetic unit 208 where they are operated on, and the operated result is transferred to the floating-point register FRi via signal line L109, selector 232, output register 233 and signal line L113 to complete the processing.

The converting circuit 226 need not necessarily be provided at a position shown in FIG. 6. If the same function is incorporated in the converting circuit 221, the processing can be further simplified.

(3) Store instruction (memory←FRi)

The data of common representation stored in the floating-point register FRi is converted into a fixed length representation or a variable length representation as designated by the operation mode, and the converted data is written into a location in storage unit 100 according to an address designated by an instruction.

First, the data of common expression of the floating-point register FRi is set to the input register 224 via signal line L106. When the operation mode is 0, i.e., when the data is to be converted into a fixed length representation, the value of input register 224 is input to the converting circuit 227 via signal line L107 and is converted into a fixed length representation, and is then transferred and written onto the storage unit 100 via selector 230, write register 231 and signal line L112. Here, the converting circuit 227 effects a conversion opposite to the conversion of fixed length representation data into common length representation data that is shown in FIG. 8(a). That is, as shown in FIG. 8(b), the common length representation data of register 404 is converted into the fixed length representation data of register 405.

Figure 10:
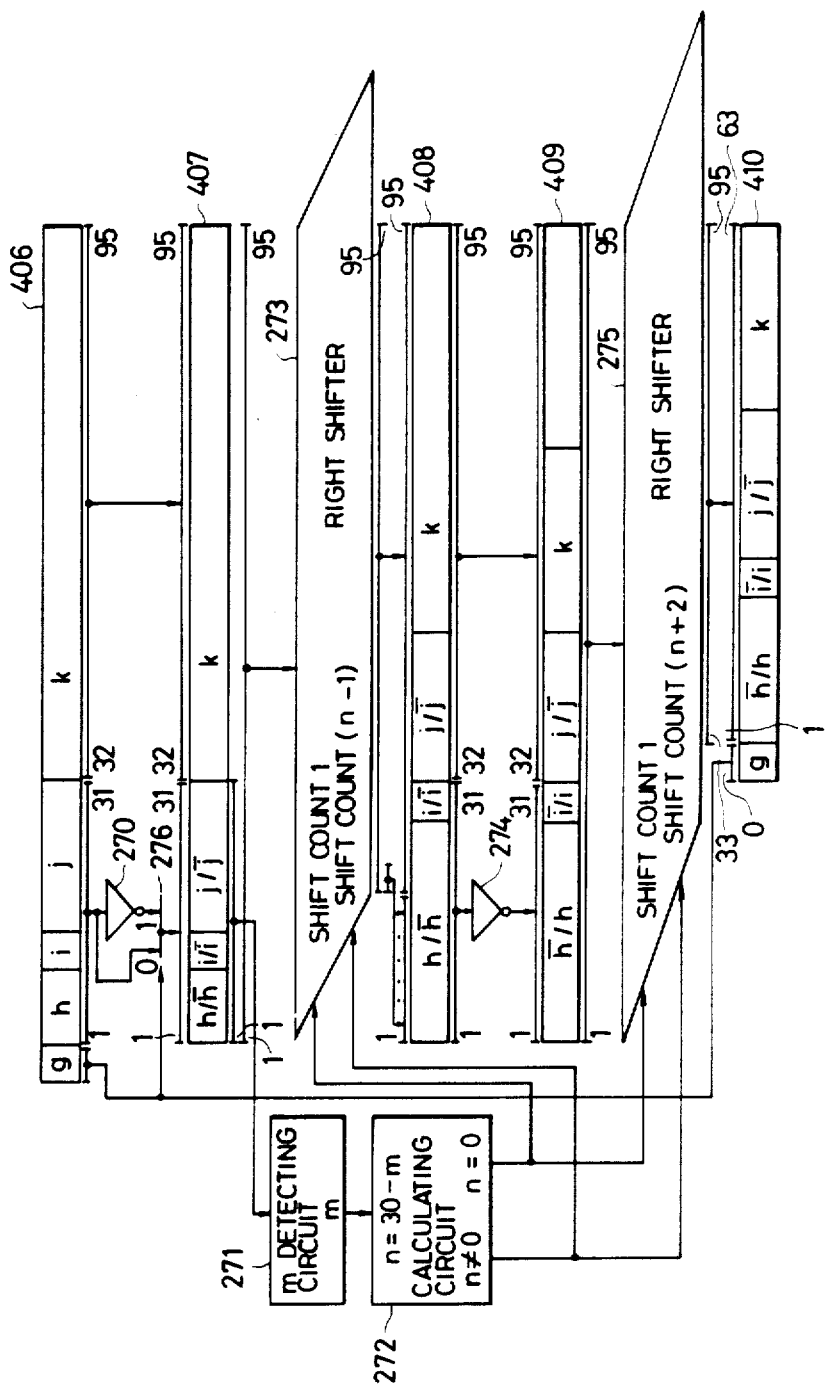

On the other hand, when the operation mode is 1, i.e., when the data is to be converted into a variable length representation, the value of input register 224 is input to the converting circuit 228 via signal line L107 and is converted into a variable length representation which is then transferred and written into the storage unit 100 via selector 230, write register 231 and signal line L112. Here, the converting circuit 228 converts the common representation data of register 406 into the variable length data of register 410 via intermediate data 1, 2, 3 of registers 407, 408, 409 as shown in FIG. 10. Reference numerals 270, 274 denote inverter circuits, 271 denotes an m detecting circuit, 272 denotes a circuit for calculating $n = 30 - m$, reference numerals 273, 275 denote right shifters, and 276 denotes a selector.

FIG. 10 illustrates the operation for converting common length data into variable length data, which, however, can be replaced by any other concrete means having the same function, as a matter of course. Referring to FIGS. 9 and 10, furthermore, the functions may be commonly utilized provided they can be commonly used. For instance, it can be proposed to commonly use the shifters that are capable of shifting in both the right and left directions.

As mentioned above, the execution processing device of the present invention is capable of executing the floating-point operations of both the variable length representation of exponent part and the fixed length representation of exponent part. Namely, the invention provides an efficient and simplified execution processing device in which the data representations of the floating-point register used for the floating-point operation and of the arithmetic unit that performs addition, subtraction, multiplication, and division, are converted into the data of common representation and are used in two operations. Further, by introducing the operation mode for distinguishing the two floating-point operations, only one set of instructions is required instead of two sets of instructions, to further improve the efficiency.

The above embodiment has dealt with two floating-point operations of the variable length representation of one exponent part and the fixed length representation of one exponent part. It is, however, possible to easily realize the execution processing device which is capable of executing the floating-point operations of the variable length representation of a plurality of exponent parts and the fixed length representation of a plurality of exponent parts, by increasing the kinds of operation modes and increasing, as required, the circuits for converting the data into common representations or for reversely converting the data from the common representations.

What is claimed is:

1. A data processing system for handling floating point data, comprising:
a plurality of register means designated by an instruction and each for holding a floating point data signal of a first kind having a fixed length exponent part of a first length;

data storage means for holding both floating point data signals of a second kind which have a fixed length exponent port of a second length and floating point data signals of a third kind which have variable length exponent parts;

conversion means connected to said data storage means and said plurality of register means and responsive to an instruction of a first kind for reading out of said data storage means a floating point data signal of the second kind or the third kind as requested by said first kind of instruction and for converting said read out floating point data signal into a corresponding floating point data signal of the first kind so as to write the corresponding floating point data signal of the first kind into one of said plurality of register means designated by the first kind of instruction;

operation means connected to said plurality of register means and responsive to an instruction of a second kind for performing an operation on a floating point data signal of the first kind read out from one of the plurality of register means designated by the first kind of instruction and for providing floating point data of the first kind as a result of the operation to one of said plurality of register means designated by the first kind of instruction;

inverse conversion means connected to said plurality of register means and responsive to an instruction of a third kind for converting a floating point data signal of a first kind read out from one of said plurality of register means designated by the third kind of instruction into corresponding floating point data of the second kind or of the third kind so as to provide the corresponding floating point data to said data storage means.

2. A data processing system according to claim 1, wherein said conversion means comprises:

first conversion means connected to said data storage means and said plurality of register means for converting a floating point data signal of the second kind fetched from said data storage means into a corresponding floating point data signal of the first kind;

second conversion means connected to said storage means and said plurality of register means for converting floating point data of the third kind into a corresponding floating point data signal of the first kind; and first select means connected to said first and second conversion means for selectively providing an output of one of said first and second conversion means to said plurality of register means;

wherein said inverse conversion means comprises:

first inverse conversion means connected to said data storage means and said plurality of register means for converting floating point data of the first kind read out of said plurality of register means into a corresponding floating point data signal of the second kind;

second inverse conversion means connected to said data storage means and said plurality of register means for converting a floating point data signal of the first kind read out of said plurality of register means into a corresponding floating point signal of the third kind, and second select means connected to said first and second conversion means for selectively providing an output of one of said first and second inverse conversion means to said data storage means.

3. A data processing system according to claim 2, further comprising:

mode indicating means connected to said first and second select means and responsive to an instruction of a fourth kind for selectively providing one of first and second mode signals to said first and second select means so as to control a select operation of said first and second select means.

4. A data processing system according to claim 1, further comprising:

mode indicating means connected to said conversion means and said inverse conversion means and responsive to an instruction of a fourth kind for providing one of first and second mode signals to said conversion means and said inverse conversion means so as to enable said conversion means to perform conversion from a floating point data signal of the second kind to a floating point data signal of the first kind or conversion from a floating point data signal of the third kind to a floating point data signal of the first kind in response to the first or second mode signal, respectively, and so as to enable said inverse conversion means to perform conversion from a floating point data signal of the first kind to a floating point data signal of the second kind or conversion from a floating point data signal of the first kind to a floating point data signal of the third kind in response to the first or second mode, respectively.

5. A data processing system according to claim 4, wherein an exponent part of each floating point data signal comprises:

a preceding part comprised of a series of "0" or a series of "1", the length thereof depending upon a value of an exponent represented by the exponent part; and succeeding part indicative of the value, the length thereof depending upon the length of the preceding part.

6. A data processing system according to claim 1, wherein said operating means includes means responsive to an instruction for performing an operation on a pair of first and second floating point data signals and for providing the result of the operation to one of said plurality of register means, said first point data signal of the second kind being provided from one of the register means designated by the instruction and said second floating point data signal of the second kind being provided from said conversion means as a result of conversion thereby of a floating point data signal of the second kind or of the third kind as requested by said instruction and fetched from said data storage means.

* * * * *